(12) United States Patent
Huang et al.

(10) Patent No.: US 7,064,693 B1
(45) Date of Patent: Jun. 20, 2006

(54) BACKGROUND COMPARATOR OFFSET CALIBRATION TECHNIQUE FOR FLASH ANALOG-TO-DIGITAL CONVERTERS

(75) Inventors: Chun-Cheng Huang, Hsinchu (TW); Jieh-Tsorng Wu, Hsin-chu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/135,218

(22) Filed: May 23, 2005

(51) Int. Cl.
*H03M 1/10* (2006.01)
(52) U.S. Cl. ...................... 341/120; 341/155
(58) Field of Classification Search ........ 341/118–120, 341/150–155
See application file for complete search history.

(56) References Cited

U.S. PATENT DOCUMENTS

| | | | | |
|---|---|---|---|---|
| 5,929,796 A | * | 7/1999 | Opris et al. ................. | 341/120 |
| 5,977,894 A | * | 11/1999 | McCarroll et al. .......... | 341/120 |
| 6,084,538 A | | 7/2000 | Kostelnik et al. | |
| 6,459,394 B1 | | 10/2002 | Nadi et al. | |
| 6,489,904 B1 | * | 12/2002 | Hisano ........................ | 341/120 |
| 6,545,628 B1 | * | 4/2003 | Aram .......................... | 341/155 |
| 6,822,601 B1 | * | 11/2004 | Liu et al. .................... | 341/120 |

OTHER PUBLICATIONS

H. Okada, Y. Hashimoto, et al. "Offset calibrating comparator array for 1.2-V, 6-bit, 4-Gsample/s flash ADCs using 0.13-μm CMOS technology," ESSCIRC 2003 Proceedings, Sep. 2003, pp. 711-714.

H. van der Ploeg, G. Hoogzaad, et al. "A 2.5-V 12-b 54-Msample/s 0.25-mm CMOS ADC in 1-mm2 with mixed signal chopping and calibration," IEEE J. Solid-State Circuits, vol. 36, Dec. 2001, pp. 1859-1867.

* cited by examiner

*Primary Examiner*—Lam T. Mai
(74) *Attorney, Agent, or Firm*—Bucknam and Archer

(57) ABSTRACT

A background-calibrated comparator and a background-calibrated flash analog-to-digital converter are disclosed for using in mixed-signal integrated circuit design in particular on the high-speed analog-to-digital converter circuit. Without affecting the operation of the comparator, the disclosure is directed at reducing the unpredictable input offset voltage originated from the variation of process parameters and environmental factors. The background-calibrated comparator includes a random chopping comparator, a calibration processor, and a random sequence generator. The background-calibrated flash analog-to-digital converter (ADC) includes a background-calibrated comparator array together with a reference voltage generator, a thermometer code edge detector, and a set of digital encoders.

7 Claims, 2 Drawing Sheets

BACKGROUND COMPARATOR OFFSET CALIBRATION TECHNIQUE FOR FLASH ANALOG-TO-DIGITAL CONVERTERS

BACKGROUND OF THE INVENTION

1. Field of the Invention

The present invention relates to a background-calibrated comparator (BCC) and a background-calibrated flash analog-to-digital converter (ADC), which are used on design of mixed-signal integrated circuit, in particular on the high-speed analog-to-digital converter circuit.

2. Discussion of Related Art

U.S. Pat. No. 6,459,394B1 entitled "Multi-bank flash ADC array with uninterrupted operation during offset calibration and auto-zero" has disclosed a flash ADC array in which the comparators are separated into two groups. When one group of comparators is processing calibration, the other group of comparators can maintain the operation of the ADC. However, it will degrade the resolution of the ADC for half. Also, this method requires calibration in approximately every 400 ms, which means the entire resolution of the ADC will degrade periodically and the method thus can only be used in the intermittent system of reading a disk.

U.S. Pat. No. 6,084,538 entitled "Offset calibration of a flash ADC array" uses conventional means of capacitor storage to calibrate and expiate the offset voltage of a single comparator. To achieve the object of background-calibration, the calibration circuit takes turns to selectively calibrate each single comparator. The comparators need to be split from the signal path during calibration and be rejoined after the calibration is done. To the entire ADC, there exists a "bubble" in the output thermometer codes because there is always a comparator in calibration. The encoder in the downstream part thus requires special design to suppress the error caused by the bubble. This method causes great complexity and large amount of wires in the circuit, whereby the operation speed is restrained.

"Offset calibrating comparator array for 1.2-V, 6-bit, 4-Gsample/s flash ADCs using 0.13-μm CMOS technology" by H. Okada, Y. Hashimoto, K. Sakata, T. Tsukada, and K. Ishibashi, ESSCIRC 2003 Proceedings, September 2003, pp. 711–714 has disclosed a pre-calibration method, wherein the calibration circuit generates a triangle wave as an input signal before the circuit operation initiates. The value of the offset voltage of each comparator is determined by the conversion property of the ADC, whereby the reference voltage of each comparator is adjusted to expiate its offset. Since pre-calibration is adopted in this method, the calibration cannot be carried once the circuit operation initiates.

"A 2.5-V 12-b 54-Msample/s 0.25-mm CMOS ADC in 1-mm2 with mixed-signal chopping and calibration," by H. van der Ploeg, G. Hoogzaad, H. A. H. Termeer, M. Vertregt, and R. L. J. Roovers, IEEE J. Solid-State Circuits, vol. 36, pp. 1859–1867, December 2001 has disclosed a two-step ADC with background calibration. In the paper, a random chopping method similar to that of the present invention is adopted to calibrate the residue amplifier. However, the object to be calibrated in this paper is an amplifier, the offset information is therefore easy to be obtained in the process of random chopping, unlike in the present invention, where the offset is hidden among big quantization noises and is difficult to be obtained since the object to be treated in the present invention is a comparator.

Additionally, the calibration loop in this paper employs the manner of periodical adjustment, which periodically detects if the accumulated output of the amplifier exceeds a predetermined threshold and adjusts the offset accordingly. However, compared with the present invention, the calibration method disclosed in this paper is not efficient enough because the offset cannot be instantly adjusted due to the periodical adjustment.

SUMMARY OF THE INVENTION

A background-calibrated comparator and a background-calibrated flash analog-to-digital converter are disclosed in the present invention. The former is composed of a random-chopping comparator and a calibration processor. The latter comprises a comparator array consisting of windowed background-calibrated comparators. The remainder parts of the background-calibrated flash analog-to-digital converter are similar to those of a standard analog-to-digital converter.

The calibration processor of the background-calibrated comparator utilizes accumulators and simple logics to obtain the polarity information of the comparator input offset voltage, according to the statistical characteristics of its output digital codes. Inside the comparator, there exists an offset-tuning mechanism, which is controlled by the calibration processor and can be used to calibrate the input offset voltage. The calibration process operates simultaneously to adjust the comparator input offset voltage close to zero and does not influence the normal function of comparison. As the calibration converges, due to the stochastic nature, the offset voltage fluctuation around zero instead of staying static. The fluctuation is referred as an input noise, which can be suppressed not to degrade the comparator performance by accurately estimating and selecting related parameters.

For a background-calibrated flash analog-to-digital converter that has N-bit resolution, the comparator array is composed of $2^N-1$ windowed background-calibrated comparators. In each windowed background-calibrated comparator, the output of the random chopping comparator is processed by the thermometer code edge detector before it can be used as the input of the calibration processor.

The thermometer code edge detector detects the thermometer code generated from the random chopping comparators and produces $2^N$ digital bits among which only the bit corresponding to the 0–1 edge of the thermometer code is 1. The output of the thermometer-code edge detector is the input of the calibration processor as well as the encoding bases of the output binary codes.

In the calibration loop, the thermometer-code edge detector plays a role to confine the input signal swing for a single comparator so that only when input signal falls in the vicinity of the corresponding reference voltage the background calibration is activated. This confinement is equivalent to a windowing effect, which can largely suppress the fluctuation noise and reduce the influence of non-uniform distributed input signal over the calibration performance.

DETAILED DESCRIPTION OF PREFERRED EMBODIMENTS

Figure 1:
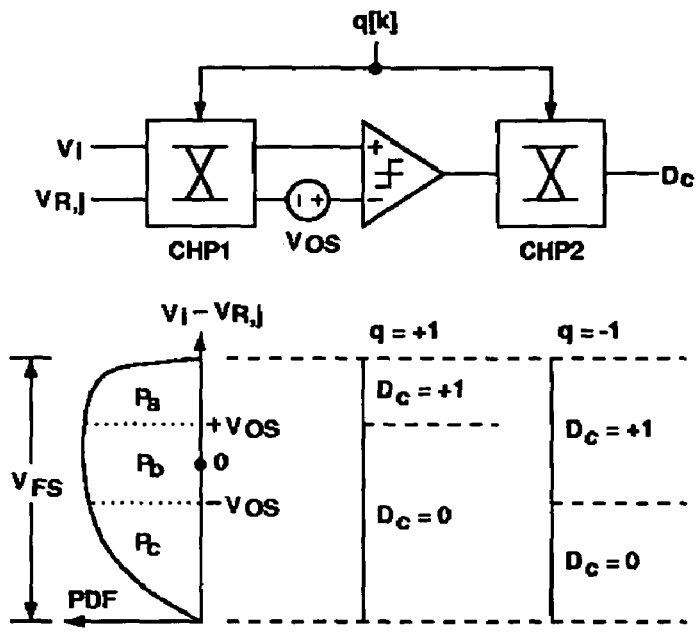
FIG. 1 is a circuit diagram showing a random chopping comparator (RCC) according to a preferred embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Further, in the drawing, like reference numerals are used to identify the same or similar parts.

A background-calibrated comparator and a background-calibrated flash analog-to-digital converter are disclosed in the present invention; the former is composed of a random-chopping comparator and a calibration processor and the latter comprises a comparator array consisting of windowed background-calibrated comparators while the remainder parts of the background-calibrated flash analog-to-digital converter are similar to those of a standard analog-to-digital converter.

FIG. 1 shows a random chopping comparator (RCC) according to a preferred embodiment of the present invention, which comprises a comparator together with two choppers CHP1 and CHP2. The input offset voltage $V_{OS}$ of the comparator is unknown; however, the comparator has an internal mechanism for tuning the $V_{OS}$, wherein the $V_{OS}$ is compensated by being controlled by an external digital control signal T[k]. CHP1 and CHP2 both have two states: in the forward state, input signals are directly connected to the input terminals of the comparator and the digital signal outputted from the comparator serves as an output signal; in the reversed state, input signals are inversed and connected to the input terminals of the comparator and the digital signal outputted from the comparator is inversed and serves as an output signal.

CHP1 and CHP2 are both under the control of random sequence q[k], which is generated by an independent random sequence generator. The probability of generating a forward or a reversed signal is 50% and has nothing to do with the input signal of the comparator ("k" represents the discrete time index). Based on the operation principle of CHP1 and CHP2, when q[k] is negative, the operation of the random chopping comparator is not affected but the polarity of its input offset voltage $V_{OS}$ is reversed.

A correlated variable "U" is defined while the RCC is in operation. When the output of the comparator is "1" and q[k] is "forward", "U" is "+1"; when the output of the comparator is "1" and q[k] is "reversed", "U" is "−1"; and when the output of the comparator is "0", "U" is "0". According to the aspect of statistics, accumulation of "U" reflects the value of $V_{OS}$ as shown in FIG. 1. When $V_{OS}$ is positive, the accumulation tends to decrease; when $V_{OS}$ is negative, the accumulation tends to increase.

Figure 2:
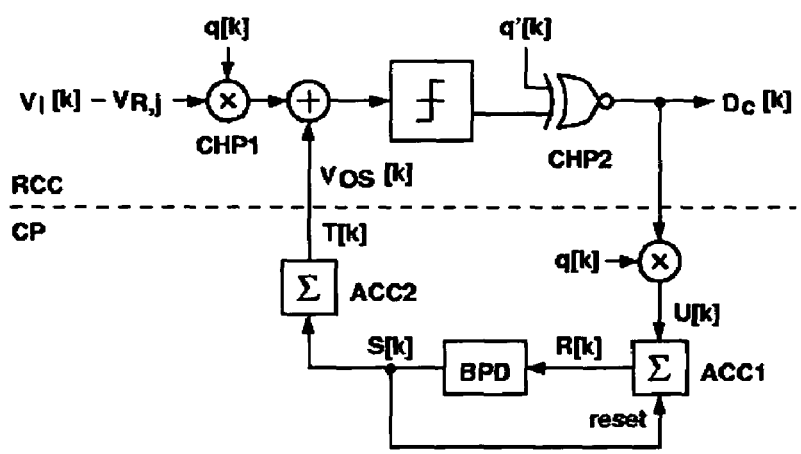
FIG. 2 is a complete block diagram showing a background-calibrated comparator (BCC) according to the preferred embodiment of the present invention.

FIG. 2 is a complete block diagram showing a background-calibrated comparator (BCC) according to the preferred embodiment of the present invention, wherein above the dotted line is a schematic view of a RCC, and below the dotted line is a calibration processor (CP) serving to automatically calibrate the input offset voltage of the comparator. The calibration processor comprises two accumulators ACC1 and ACC2 and a bilateral peak detector (BPD). ACC1 accumulates the value of U[k] and outputs an accumulation result R[k]. According to the aforementioned description, the variation of R[k] reflects the value of $V_{OS}$, whereby the polarity of $V_{OS}$ can be estimated. The longer the accumulation time, the more the number of times of the accumulation and the higher the reliability are.

BPD is used to monitor R[k], wherein in the BPD exists a predetermined threshold $N_C$; whenever R[k] is higher than $N_C$, BPD outputs the signal of S[k]=+1; whenever R[k] is lower than $-N_C$, BPD outputs the signal of S[k]=−1. S[k] remains "0" in the other cases. Once S[k] is non-zero, ACC1 will be reset to "0" synchronously, and the accumulation will restart. Therefore the non-zero S[k] can only remain for one clock cycle. The non-zero S[k] is sufficiently reliable to be used to determine the polarity of $V_{OS}$.

ACC2 functions to accumulate S[k], wherein the accumulation result T[k] of which is used for controlling the offset voltage of the comparator. Whenever T[k] adds 1, the offset voltage increases for a fixed small amount $\Delta V$. $V_{OS}$ can be expressed as $V_{OS}[k]=V_{OS}[0]+T[k]\times\Delta V$ in any time, where $V_{OS}[0]$ is the inherent offset voltage of the comparator before the calibration loop initiates.

$V_{OS}$ does not converge to a fixed value but fluctuates around "0". The fluctuation can be referred as an input noise, which is related to $N_C$ and V. The noise can be maintained in the range not to affect the performance of the comparator by estimating and selecting variables according to the random process theory.

Figure 3:
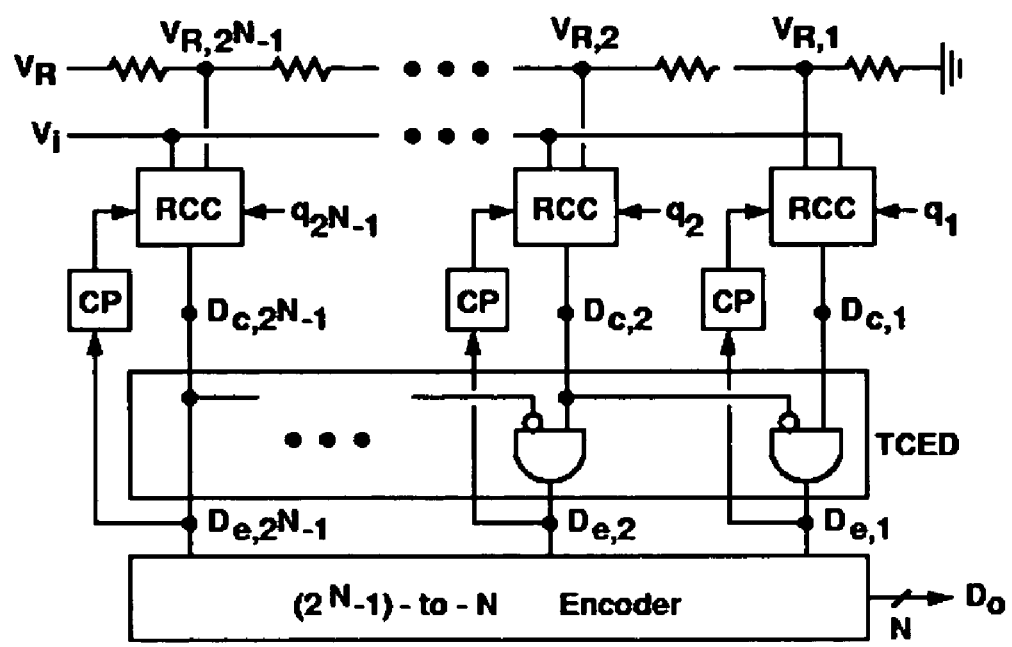
FIG. 3 is a circuit diagram showing a background-calibrated flash analog-to-digital converter (ADC) according to the preferred embodiment of the present invention.

FIG. 3 shows a background-calibrated flash analog-to-digital converter (ADC) with N-bit resolution according to the preferred embodiment of the present invention. The comparator array in FIG. 3 comprises $2^N-1$ windowed BCC, whose structure is a little different from that of the BCC in FIG. 2. The output signals of the RCC of the windowed BCC are first processed by a thermometer code edge detector (TCED), calibration processors then use the outputs of the TCED as input signals.

TCED consists of AND gates. The thermometer codes generated by the comparator array serve as the input of the TCED, which outputs $2^N$ bits and only the bits corresponding to the 0–1 edge of the thermometer codes are "1" while the remainder bits are "0". The TCED can detect the edge of the thermometer codes "1" and "0", which is the basic component of a flash ADC. The combination of BCC and TCED enforces U to be non-zero only when the input signal is near the corresponding reference voltage of each comparator. This adjustment is equivalent to introducing a "windowing" effect to every BCC, which can greatly suppress the fluctuation noise and reduce the influence on the calibration performance caused by the inhomogeneous distribution of the input signals.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A background-calibrated comparator, comprising:
    a random chopping comparator for comparing an input signal with a reference signal and outputting a digital signal that shows the comparison result; wherein the random chopping comparator is controlled by an external random sequence to randomly forward or reverse the polarity of the input offset voltage of the comparator without affecting the operation of the comparator; meanwhile, the input offset voltage of the random chopping comparator is adjusted by the external digital control signal;
    a calibration processor, whose input signal is the output signal of the random chopping comparator and the random sequence for controlling the polarity of the offset voltage; the output of the calibration processor is a digital control signal for adjusting the offset voltage of the random chopping comparator; the calibration processor operates with the comparator to dynamically calibrate the offset voltage of the comparator; and a random sequence generator, which generates a signal with possibility of forward or reverse to serve as a chopping signal of the random chopping comparator; the possibility of generating a forward or a reversed signal is random, and the probability of each is 50%.

2. The background-calibrated comparator as recited in claim 1, wherein the random chopping comparator further comprises an input/output port chopping network controlled by an external random sequence and an offset-calibrated comparator; when the external random sequence is forward, the chopping network directly connects the input port signal to the input terminal of the comparator and the digital signal outputted from the comparator to the output port; when the external random sequence is reversed, the chopping network inverses the input port signal and connects it to the input terminal of the comparator and inverses the digital signal outputted from the comparator and connects it to the output port.

3. The background-calibrated comparator as recited in claim 2, wherein the offset-calibrated comparator further comprises an offset-tuning mechanism which is under the control of an external digital control signal; when the value of the digital control signal adds 1, the offset voltage of the comparator increases for a fixed small amount; when the value of the digital control signal subtracts 1, the offset voltage of the comparator decreases for a fixed small amount.

4. The background-calibrated comparator as recited in claim 1, wherein the calibration processor further comprises:
   a sign-controllable accumulator, whose input signal is an output signal of the comparator, wherein the sign of the input signal is controlled by the random sequence that controls the polarity of the offset voltage; when the random sequence is "forward", the input is directly accumulated by the accumulator; when the random sequence is "reversed", the sign of the input signal is reversed and accumulated; the sign-controllable accumulator comprises a reset terminal from which the accumulator receives a "reset" signal to reset the accumulated value back to zero;
   a bilateral peak detector, the input of which is the accumulation result of the sign-controllable accumulator, wherein in the bilateral peak detector exists a predetermined threshold; when the accumulation result exceeds the predetermined threshold, the detector outputs "+1" and resets the sign-controllable accumulator synchronously; when the accumulation result is lower than the negative value of the predetermined threshold, the detector outputs "−1" and resets the sign-controllable accumulator synchronously; and
   a regular accumulator, which accumulates the outputs of the bilateral peak detector and whereby the accumulation result serves as a digital control signal for the offsets of the random chopping comparator.

5. A background-calibrated flash analog-to-digital converter with N-bit resolution, comprising:
   a set of reference voltage generators, which generate $2^N-1$ reference voltages being numbered as the n-th reference voltage sequentially, where n is any integer among 1 to $2^N-1$;
   a comparator array, which compares an input analog signal with the reference voltages and outputs $2^N-1$ bits of thermometer codes being numbered as the n-th thermometer code bit sequentially, where n is any integer among 1 to $2^N-1$; when the analog signal is higher than the n-th reference voltage, the 1st to (n−1)-th thermometer code bits are set as "1" and the other bits are set as "0"; the comparator array is also provided with background calibration function which automatically calibrates the offset voltages of every comparator in the array so as to gradually adjust the offset voltages to the approximate value of zero;
   a thermometer code edge detector (TCED), which inputs $2^N-1$ bits of thermometer codes and outputs $2^N-1$ bits of digital signals; the thermometer code edge detector detects the 0–1 edge of the input thermometer codes and sets the corresponding output digital bits as "1" and the rest as "0";
   a set of digital encoders, which encodes the $2^N$ digital bits outputted from the background-calibrated comparator array as N-bit binary codes; and
   a random sequence generator, which generates random sequences needed by the comparator array.

6. The background-calibrated flash analog-to-digital converter as recited in claim 5, wherein the comparator array further comprises $2^N-1$ windowed background-calibrated comparator being numbered as the n-th windowed background-calibrated comparator sequentially, where n is any integer among 1 to $2^N-1$; the n-th windowed background-calibrated comparator consists of a set of random chopping comparators and a set of calibration processors, wherein the outputs of the random chopping comparators serves as the (n−1)-th and n-th input bits of the thermometer code edge detector, and the n-th output bit of the thermometer code edge detector serves as the inputs of the calibration processors.

7. The background-calibrated flash analog-to-digital converter as recited in claim 5, wherein the random sequence generator generates more than 2 independent random sequences for controlling each windowed random chopping comparator in the comparator array; the n-th random sequence required by the corresponding n-th comparator has to be independent of both the (n−1)-th random sequence and the (n+1)-th random sequence; when the random sequence generator generates two random sequences, the odd comparators share a same random sequence, and the even comparators share the other random sequence; when the random sequence generator generates more than two random sequences, the permutations are analogical, but the random sequences used by adjacent comparators remain independent of each other.

* * * * *